US012418293B2

(12) United States Patent
Huang

(10) Patent No.: US 12,418,293 B2
(45) Date of Patent: Sep. 16, 2025

(54) OPERATION STAGE OF PIPELINE ANALOG-TO-DIGITAL CONVERTER (ADC) AND MULTIPLYING CIRCUIT THEREOF

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 127 days.

(21) Appl. No.: 18/420,801

(22) Filed: Jan. 24, 2024

(65) Prior Publication Data
US 2024/0283456 A1 Aug. 22, 2024

(30) Foreign Application Priority Data
Feb. 17, 2023 (TW) .................. 112105778

(51) Int. Cl.
*H03K 19/173* (2006.01)
*H03K 17/687* (2006.01)

(52) U.S. Cl.
CPC ..... *H03K 19/1737* (2013.01); *H03K 17/6872* (2013.01)

(58) Field of Classification Search
CPC ...... H03M 1/12; H03K 17/687; H03K 19/173
See application file for complete search history.

(56) References Cited

U.S. PATENT DOCUMENTS

| 5,525,934 | A  | * | 6/1996 | Chiu ................. | H03F 3/45659 327/380 |
| 7,315,196 | B2 | * | 1/2008 | Wada .................... | H02M 3/073 327/536 |
| 10,979,066 | B1 | * | 4/2021 | Huang ................. | H03M 1/468 |
| 11,265,007 | B2 | * | 3/2022 | Kurahashi ........... | H03M 1/1245 |

(Continued)

OTHER PUBLICATIONS

OA letter of a counterpart TW application (appl. No. 112105778) mailed on Sep. 22, 2023. Summary of the TW OA letter. (1) Claim(s) 1 and 10 are rejected under Patent Law Article 22(1) as allegedly being anticipated by reference 1 (US 2016/0105193 A1). (2) Claims 2-9 are allowed. Claim correspondence between the TW counterpart application and the instant US application: Claims 1-10 in the TW counterpart application correspond to claims 1-10 in the instant US Application, respectively.

*Primary Examiner* — Lam T Mai
(74) *Attorney, Agent, or Firm* — WPAT, PC

(57) ABSTRACT

A multiplying circuit of an operation stage of a pipeline analog-to-digital converter (ADC) has first and second output terminals and is configured to generate first and second output signals according to first and second input signals. The multiplying circuit includes a voltage conversion circuit, first and second transistors, and first and second current sources. The voltage conversion circuit is configured to generate a first intermediate voltage and a second intermediate voltage according to the first input signal and the second input signal. The first transistor has a first terminal coupled to the first output terminal, a second terminal coupled to a power supply voltage, and a first control (Continued)

terminal receiving the first intermediate voltage. The second transistor has a third terminal coupled to the second output terminal, a fourth terminal coupled to the power supply voltage, and a second control terminal receiving the second intermediate voltage.

20 Claims, 7 Drawing Sheets

(56) References Cited

U.S. PATENT DOCUMENTS

| | | | |
|---|---|---|---|
| 2009/0028570 A1* | 1/2009 | Tseng | H03M 1/54 |
| | | | 398/115 |
| 2014/0132436 A1* | 5/2014 | Tai | H03M 1/00 |
| | | | 341/155 |
| 2015/0109161 A1* | 4/2015 | Trampitsch | H03K 17/063 |
| | | | 341/172 |
| 2016/0105193 A1 | 4/2016 | Oshima | |
| 2020/0028518 A1* | 1/2020 | Wu | H03M 1/442 |
| 2022/0029632 A1* | 1/2022 | Kurahashi | H03M 1/167 |
| 2022/0158649 A1* | 5/2022 | Zhang | H03M 1/44 |
| 2022/0360255 A1* | 11/2022 | Chuang | G05F 1/44 |
| 2023/0091800 A1* | 3/2023 | Huang | H03K 17/04123 |
| | | | 327/390 |
| 2023/0308015 A1* | 9/2023 | Huang | H02M 3/07 |
| 2023/0402918 A1* | 12/2023 | Hunter | H02M 3/1563 |
| 2024/0204769 A1* | 6/2024 | Chen | H03K 17/102 |
| 2024/0283456 A1* | 8/2024 | Huang | H03K 17/6872 |
| 2024/0380407 A1* | 11/2024 | Huang | H03M 1/1205 |
| 2024/0396507 A1* | 11/2024 | Huang | H03F 1/0255 |
| 2024/0429932 A1* | 12/2024 | Huang | H03M 1/0836 |
| 2024/0429933 A1* | 12/2024 | Huang | H03M 1/1245 |
| 2025/0158630 A1* | 5/2025 | Huang | H03M 1/164 |
| 2025/0226836 A1* | 7/2025 | Huang | H03M 1/50 |

* cited by examiner

OPERATION STAGE OF PIPELINE ANALOG-TO-DIGITAL CONVERTER (ADC) AND MULTIPLYING CIRCUIT THEREOF

BACKGROUND OF THE INVENTION

1. Field of the Invention

The present invention generally relates to a pipeline analog-to-digital converter (ADC) (also known as a pipelined ADC), and, more particularly, to an operation stage of the pipeline ADC and a multiplying circuit thereof.

2. Description of Related Art

FIG. 1 is a conventional multiplying circuit. The multiplying circuit 100 can be used for a multiplying digital-to-analog converter (MDAC). The multiplying circuit 100 includes an operational amplifier 110, a capacitor C1, a capacitor C2, a switch SW1, a switch SW2, a switch SW3, a switch SW4, and a switch SW5. The operating principle of the MDAC is well known to people having ordinary skill in the art, and the details are omitted for brevity. When the multiplying circuit 100 is implemented in the MDAC of a 1.5-bit pipeline analog-to-digital converter (ADC) (also known as a pipelined ADC), the multiplying circuit 100 amplifies the input signal Vi by two times. In other pipeline ADCs, the multiplying circuit (also including an operational amplifier) amplifies the input signal Vi by more times (e.g., four times, eight times, . . . ). However, the greater the amplification, the larger the area of the operational amplifier and the higher the power consumption. Furthermore, because the multiplying circuit 100 is a closed loop, frequency compensation is required, but frequency compensation also increases power consumption.

SUMMARY OF THE INVENTION

In view of the issues of the prior art, an object of the present invention is to provide an operation stage of a pipeline analog-to-digital converter (ADC) and a multiplying circuit thereof, so as to make an improvement to the prior art.

According to one aspect of the present invention, an operation stage of a pipeline ADC is provided. The operation stage of the pipeline ADC has a first output terminal and a second output terminal and is configured to generate a first output signal and a second output signal according to a first input signal and a second input signal. The operation stage includes a sub-ADC, a multiplexer, a voltage conversion circuit, a first transistor, a first current source, a second transistor, and a second current source. The sub-ADC is configured to generate a digital code according to the first input signal and the second input signal. The multiplexer is coupled to the sub-ADC and configured to generate a first reference voltage and a second reference voltage according to the digital code. The voltage conversion circuit is configured to generate a first intermediate voltage and a second intermediate voltage according to the first input signal, the second input signal, the first reference voltage, and the second reference voltage. The first transistor has a first terminal, a second terminal, and a first control terminal. The first terminal is coupled to the first output terminal, the second terminal is coupled to a first power supply voltage, and the first control terminal receives the first intermediate voltage. The first current source is coupled between the first terminal and a second power supply voltage. The second transistor has a third terminal, a fourth terminal, and a second control terminal. The third terminal is coupled to the second output terminal, the fourth terminal is coupled to the first power supply voltage, and the second control terminal receives the second intermediate voltage. The second current source is coupled between the third terminal and the second power supply voltage.

According to another aspect of the present invention, a multiplying circuit is provided. The multiplying circuit has a first output terminal and a second output terminal and is configured to generate a first output signal and a second output signal according to a first input signal and a second input signal. The multiplying circuit includes a voltage conversion circuit, a first transistor, a first current source, a second transistor, and a second current source. The voltage conversion circuit is configured to generate a first intermediate voltage and a second intermediate voltage according to the first input signal and the second input signal. The first transistor has a first terminal, a second terminal, and a first control terminal. The first terminal is coupled to the first output terminal, the second terminal is coupled to a first power supply voltage, and the first control terminal receives the first intermediate voltage. The first current source is coupled between the first terminal and a second power supply voltage. The second transistor has a third terminal, a fourth terminal, and a second control terminal. The third terminal is coupled to the second output terminal, the fourth terminal is coupled to the first power supply voltage, and the second control terminal receives the second intermediate voltage. The second current source is coupled between the third terminal and the second power supply voltage.

The technical means embodied in the embodiments of the present invention can solve at least one of the problems of the prior art. Therefore, compared to the prior art, the present invention can reduce power consumption.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be interpreted accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

The disclosure herein includes an operation stage of a pipeline analog-to-digital converter (ADC) and a multiplying circuit thereof. On account of that some or all elements of the operation stage of the pipeline ADC and the multiplying circuit thereof could be known, the detail of such elements is omitted provided that such detail has little to do with the features of this disclosure, and that this omission nowhere dissatisfies the specification and enablement requirements. A person having ordinary skill in the art can choose components equivalent to those described in this specification to carry out the present invention, which means that the scope of this invention is not limited to the embodiments in the specification.

Figure 2:
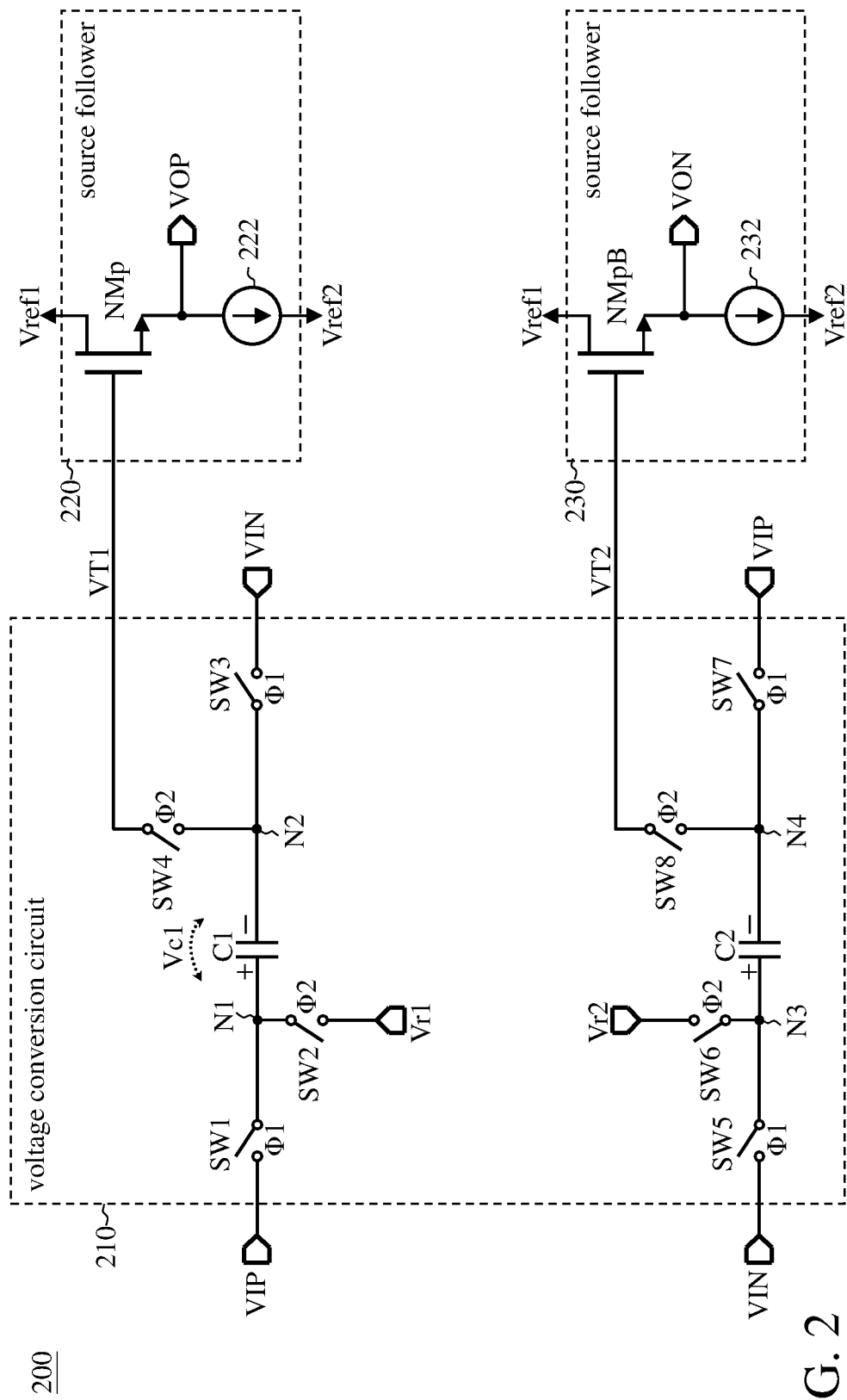
FIG. 2 is a multiplying circuit according to an embodiment of the present invention.

FIG. 2 is an embodiment of a multiplying circuit of the present invention. The multiplying circuit 200 includes a voltage conversion circuit 210, a source follower 220, and a source follower 230. The multiplying circuit 200 has a first input terminal (i.e., the terminal that receives the input signal VIP), a second input terminal (i.e., the terminal that receives the input signal VIN), a first output terminal (i.e., the terminal that outputs the output signal VOP), and a second output terminal (i.e., the terminal that outputs the output signal VON). The multiplying circuit 200 generates the output signal VOP and the output signal VON according to the input signal VIP and the input signal VIN.

The input signal VIP and the input signal VIN are a differential signal pair. In other words, the input signal VIP is the common mode voltage Vcm of the input signal VIP and the input signal VIN plus a voltage difference dV, and the input signal VIN is the common mode voltage Vcm minus the voltage difference dV. That is to say, the voltage difference dV is the signal component of the differential signal pair.

The voltage conversion circuit 210 generates an intermediate voltage VT1 and an intermediate voltage VT2 according to the input signal VIP and the input signal VIN. More specifically, the voltage conversion circuit 210 includes a capacitor C1, a capacitor C2, a switch SW1, a switch SW2, a switch SW3, a switch SW4, a switch SW5, a switch SW6, a switch SW7, and a switch SW8. The two terminals of the capacitor C1 are the node N1 and the node N2 respectively. The two terminals of the capacitor C2 are the node N3 and the node N4 respectively.

The source follower 220 generates the output signal VOP according to the intermediate voltage VT1. More specifically, the source follower 220 includes a transistor NMp and a current source 222. The first terminal (e.g., the source) of the transistor NMp is coupled or electrically connected to one of the output terminals of the multiplying circuit 200; the second terminal (e.g., the drain) of the transistor NMp is coupled or electrically connected to the first power supply voltage Vref1 of the source follower; the control terminal (e.g., the gate) of the transistor NMp is coupled or electrically connected to the node N2. The current source 222 is coupled between the source of the transistor NMp and the second power supply voltage Vref2 of the source follower. The first power supply voltage Vref1 is greater than the second power supply voltage Vref2.

The source follower 230 generates the output signal VON according to the intermediate voltage VT2. More specifically, the source follower 230 includes a transistor NMpB and a current source 232. The first terminal (e.g., the source) of the transistor NMpB is coupled or electrically connected to the other output terminal of the multiplying circuit 200; the second terminal (e.g., the drain) of the transistor NMpB is coupled or electrically connected to the first power supply voltage Vref1; the control terminal (e.g., the gate) of the transistor NMpB is coupled or electrically connected to the node N4. The current source 232 is coupled between the source of the transistor NMpB and the second power supply voltage Vref2.

One terminal of the switch SW1 receives the input signal VIP; the other terminal of the switch SW1 is coupled or electrically connected to the node N1.

One terminal of the switch SW2 receives the reference voltage Vr1; the other terminal of the switch SW2 is coupled or electrically connected to the node N1.

One terminal of the switch SW3 receives the input signal VIN; the other terminal of the switch SW3 is coupled or electrically connected to the node N2.

One terminal of the switch SW4 is coupled or electrically connected to the node N2; the other terminal of the switch SW4 is coupled or electrically connected to the source follower 220 (more specifically, to the control terminal of the transistor NMp).

One terminal of the switch SW5 receives the input signal VIN; the other terminal of the switch SW5 is coupled or electrically connected to the node N3.

One terminal of the switch SW6 receives the reference voltage Vr2; the other terminal of the switch SW6 is coupled or electrically connected to the node N3.

One terminal of the switch SW7 receives the input signal VIP; the other terminal of the switch SW7 is coupled or electrically connected to the node N4.

One terminal of the switch SW8 is coupled or electrically connected to the node N4; the other terminal of the switch SW8 is coupled or electrically connected to the source follower 230 (more specifically, to the control terminal of the transistor NMpB).

The reference voltage Vr1 and the reference voltage Vr2 may be any direct current (DC) voltage. In some embodiments, the reference voltage Vr1 and the reference voltage Vr2 are the common mode voltage Vcm of the input signal VIP and the input signal VIN.

The switches SW1 through SW8 operate according to a clock, and the duty cycle of the clock may be 50%.

In a first phase of the clock (e.g., a high level), the switches SW1, SW3, SW5, and SW7 are turned on (referred to in the figure as phase "Φ1"), and the switches SW2, SW4, SW6, and SW8 are turned off. As a result, the voltage Vc1 across the capacitor C1 is VIP−VIN=(Vcm+dV)−(Vcm−dV)=2dV, and the voltage across the capacitor C2 is VIN−VIP=(Vcm−dV)−(Vcm+dV)=−2dV.

In a second phase of the clock (e.g., a low level), the switches SW1, SW3, SW5, and SW7 are turned off, and the switches SW2, SW4, SW6, and SW8 are turned on (referred to in the figure as phase "Φ2"). As a result, the intermediate voltage VT1 is Vr1−2dV, and the intermediate voltage VT2 is Vr2+2dV.

The source follower 220 and the source follower 230 respectively output the output signal VOP and the output signal VON in the second phase. The output signal VOP is VT1−Vt=Vr1−2dV−Vt, and the output signal VON is VT2−Vt=Vr2+2dV−Vt (Vt is the threshold voltage of the transistor NMp and the transistor NMpB). In other words, the multiplying circuit 200 amplifies the signal component (i.e., the voltage difference dV) of the input signal VIP and the input signal VIN by two times.

Note that the switches SW4 and SW8 can be omitted. That is to say, in an alternative embodiment, the control terminal of the transistor NMp may be electrically connected to the node N2, and the control terminal of the transistor NMpB may be electrically connected to the node N4.

Figure 3:
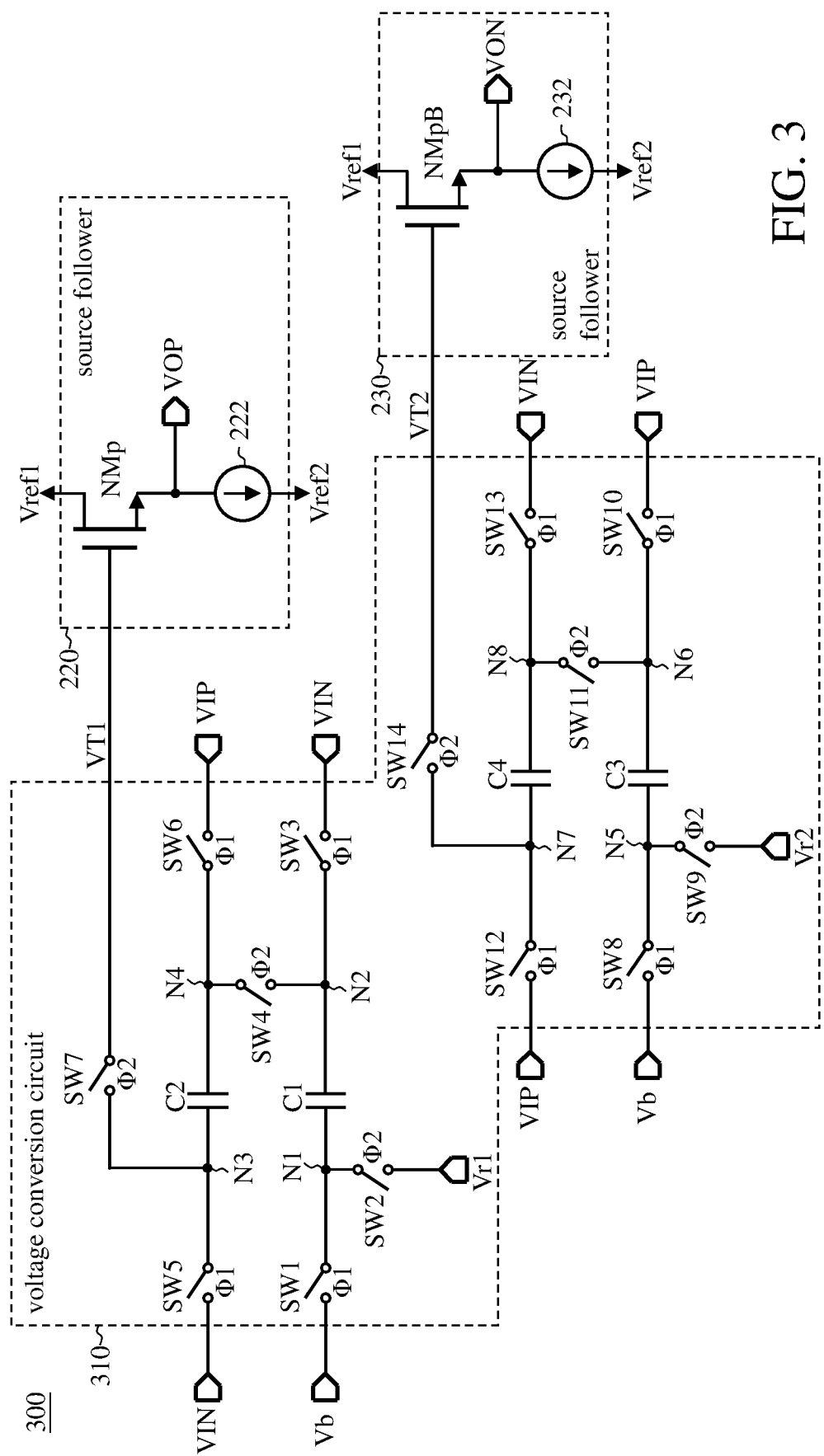
FIG. 3 is a multiplying circuit according to another embodiment of the present invention.

FIG. 3 is the multiplying circuit according to another embodiment of the present invention. The multiplying circuit 300 includes a voltage conversion circuit 310, a source follower 220, and a source follower 230.

The voltage conversion circuit 310 generates the intermediate voltage VT1 and the intermediate voltage VT2 according to the input signal VIP, the input signal VIN, and the reference voltage Vb. More specifically, the voltage conversion circuit 310 includes a capacitor C1, a capacitor C2, a capacitor C3, a capacitor C4, a switch SW1, a switch SW2, a switch SW3, a switch SW4, a switch SW5, a switch SW6, a switch SW7, a switch SW8, a switch SW9, a switch SW10, a switch SW11, a switch SW12, a switch SW13, and a switch SW14. The two terminals of the capacitor C1 are the node N1 and the node N2 respectively. The two terminals of the capacitor C2 are the node N3 and the node N4 respectively. The two terminals of the capacitor C3 are the node N5 and the node N6 respectively. The two terminals of the capacitor C4 are the node N7 and the node N8 respectively.

One terminal of the switch SW1 receives the reference voltage Vb; the other terminal of the switch SW1 is coupled or electrically connected to the node N1.

One terminal of the switch SW2 receives the reference voltage Vr1; the other terminal of the switch SW2 is coupled or electrically connected to the node N1.

One terminal of the switch SW3 receives the input signal VIN; the other terminal of the switch SW3 is coupled or electrically connected to the node N2.

One terminal of the switch SW4 is coupled or electrically connected to the node N2; the other terminal of the switch SW4 is coupled or electrically connected to the node N4.

One terminal of the switch SW5 receives the input signal VIN; the other terminal of the switch SW5 is coupled or electrically connected to the node N3.

One terminal of the switch SW6 receives the input signal VIP; the other terminal of the switch SW6 is coupled or electrically connected to the node N4.

One terminal of the switch SW7 is coupled or electrically connected to the node N3; the other terminal of the switch SW7 is coupled or electrically connected to the control terminal of the transistor NMp.

One terminal of the switch SW8 receives the reference voltage Vb; the other terminal of the switch SW8 is coupled or electrically connected to the node N5.

One terminal of the switch SW9 receives the reference voltage Vr2; the other terminal of the switch SW9 is coupled or electrically connected to the node N5.

One terminal of the switch SW10 receives the input signal VIP; the other terminal of the switch SW10 is coupled or electrically connected to the node N6.

One terminal of the switch SW11 is coupled or electrically connected to the node N6; the other terminal of the switch SW11 is coupled or electrically connected to the node N8.

One terminal of the switch SW12 receives the input signal VIP; the other terminal of the switch SW12 is coupled or electrically connected to the node N7.

One terminal of the switch SW13 receives the input signal VIN; the other terminal of the switch SW13 is coupled or electrically connected to the node N8.

One terminal of the switch SW14 is coupled or electrically connected to the node N7; the other terminal of the switch SW14 is coupled or electrically connected to the control terminal of the transistor NMpB.

The reference voltage Vb may be any DC voltage. In some embodiments, the reference voltage Vb is the common mode voltage Vcm of the input signal VIP and the input signal VIN.

In the first phase of the clock, the switches SW1, SW3, SW5, SW6, SW8, SW10, SW12, and SW13 are turned on, and the switches SW2, SW4, SW7, SW9, SW11, and SW14 are turned off. As a result, the voltage across the capacitor C1 is Vb−Vcm+dV, the voltage across the capacitor C2 is VIN−VIP=−2dV, the voltage across the capacitor C3 is Vb−Vcm−dV, and the voltage across the capacitor C4 is VIP−VIN=2dV.

In the second phase of the clock, the switches SW1, SW3, SW5, SW6, SW8, SW10, SW12, and SW13 are turned off, and the switches SW2, SW4, SW7, SW9, SW11, and SW14 are turned on. As a result, the intermediate voltage VT1 is Vr1−(Vb−Vcm+dV)+(−2dV)=Vcm−3dV (when Vr1=Vb=Vcm), and the intermediate voltage VT2 is Vr2−(Vb−Vcm−dV)+(2dV)=Vcm+3dV (when Vr2=Vb=Vcm). In other words, the multiplying circuit 300 amplifies the signal component of the input signal VIP and the input signal VIN (i.e., the voltage difference dV) by three times.

Note that the switches SW7 and SW14 can be omitted. That is to say, in an alternative embodiment, the control terminal of the transistor NMp may be electrically connected to the node N3, and the control terminal of the transistor NMpB may be electrically connected to the node N7.

Figure 4:
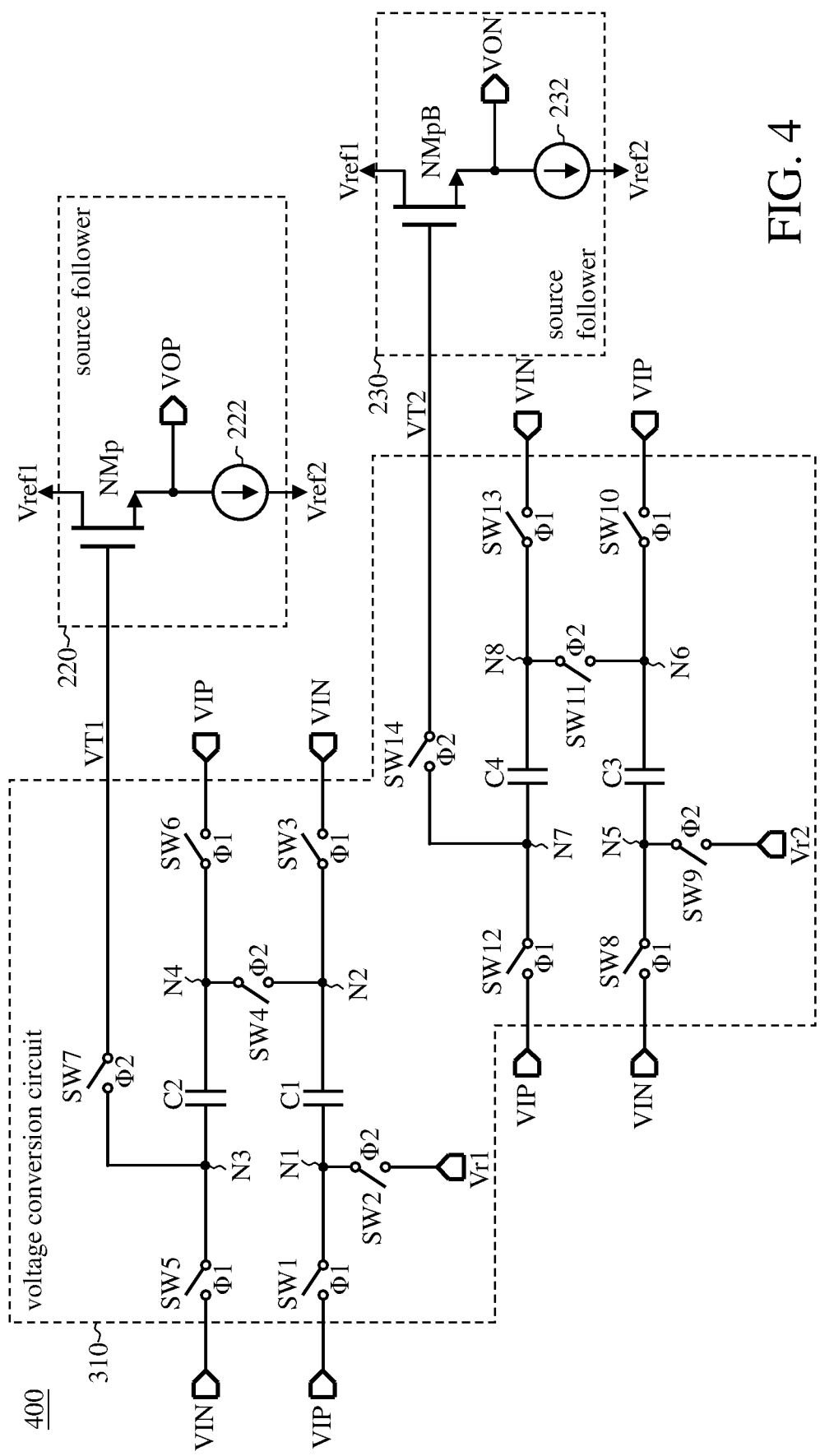
FIG. 4 is a multiplying circuit according to another embodiment of the present invention.

FIG. 4 is a multiplying circuit according to another embodiment of the present invention. The multiplying circuit 400 includes a voltage conversion circuit 310, a source follower 220, and a source follower 230. The multiplying circuit 400 is similar to the multiplying circuit 300, except that in the embodiment of FIG. 4, one terminal of the switch SW1 receives the input signal VIP (instead of the reference voltage Vb), and one terminal of the switch SW8 receives the input signal VIN (instead of the reference voltage Vb). People having ordinary skill in the art can know based on the discussion of FIG. 3 that the intermediate voltage VT1 is Vcm−4dV (when Vr1=Vcm), and the intermediate voltage VT2 is Vcm+4dV (when Vr2=Vcm). In other words, the multiplying circuit 400 amplifies the signal component of the input signal VIP and the input signal VIN (i.e., the voltage difference dV) by four times.

Figure 1:
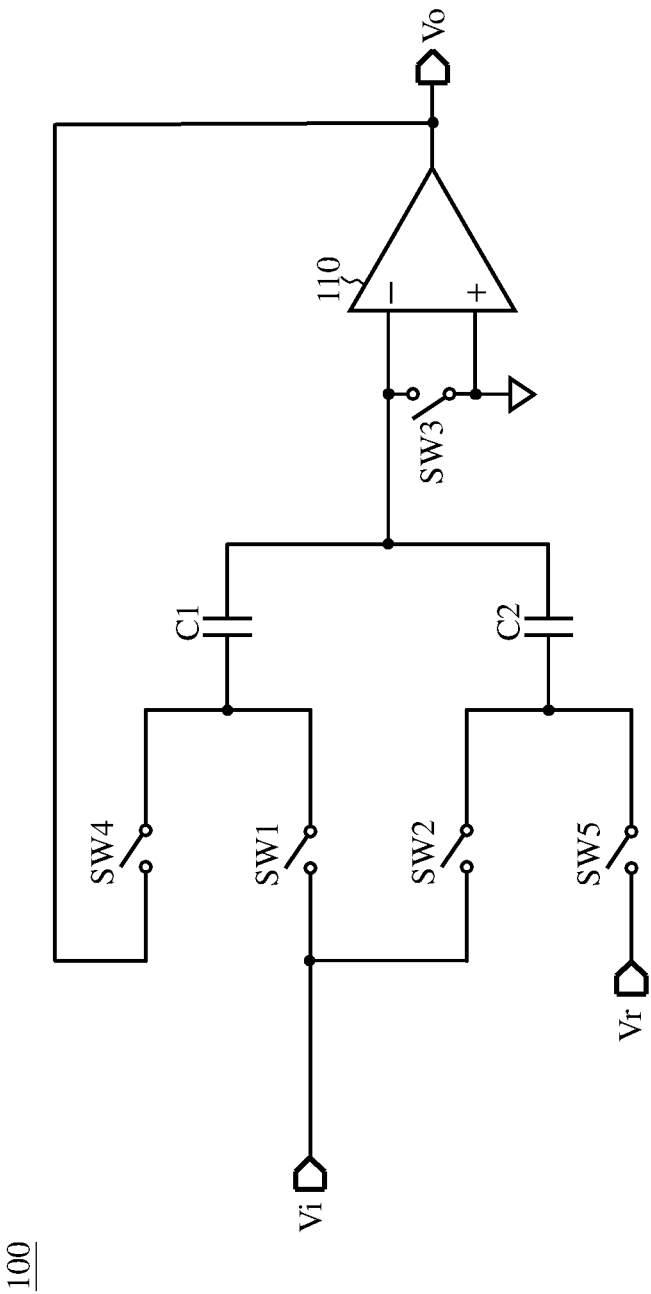
FIG. 1 is a conventional multiplying circuit.

Compared to the multiplying circuit 100 of FIG. 1, the multiplying circuit 200, the multiplying circuit 300, and the multiplying circuit 400 of the present invention have at least the following advantages: (1) lower power consumption due to not using an operational amplifier; and (2) no need for frequency compensation due to not being a closed loop.

Figure 5:
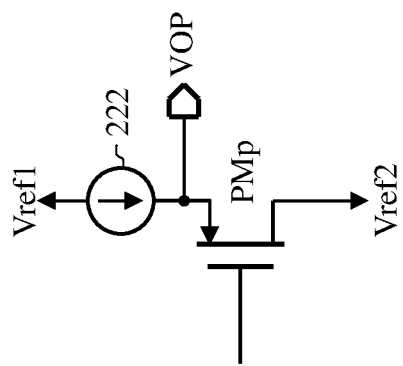
FIG. 5 shows a source follower embodied by a P-channel Metal-Oxide-Semiconductor Field-Effect Transistor (a PMOS transistor).

FIG. 5 shows a source follower embodied by a P-channel Metal-Oxide-Semiconductor Field-Effect Transistor (hereinafter referred to as a PMOS transistor). The first terminal (e.g., the source) of the transistor PMp outputs the output signal VOP; the second terminal (e.g., the drain) of the transistor PMp is coupled or electrically connected to the second power supply voltage Vref2. The current source 222 is coupled between the first power supply voltage Vref1 and the first terminal of the transistor PMp. In some embodiments, the source follower 220 and the source follower 230 may alternatively be embodied by the source follower of FIG. 5.

Figure 6:
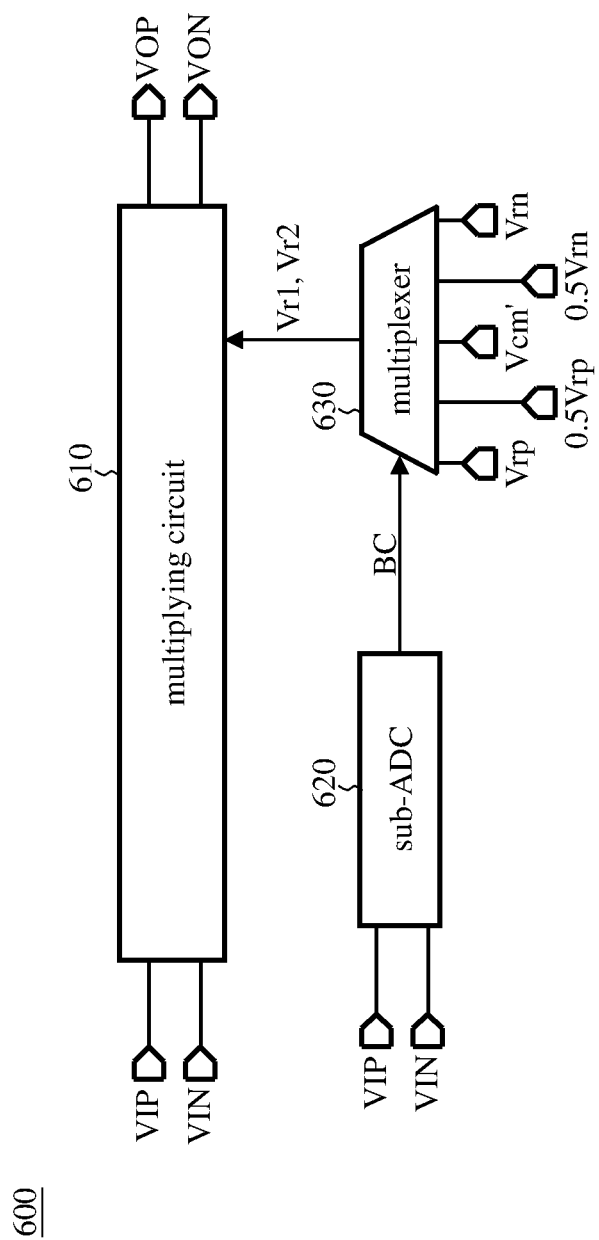
FIG. 6 is a functional block diagram of an operation stage of a pipeline analog-to-digital converter (ADC) according to an embodiment of the present invention.

The multiplying circuit 200, the multiplying circuit 300, and the multiplying circuit 400 may be used in an operation stage of a pipeline analog-to-digital converter (ADC) (also known as a pipelined ADC). Reference is made to FIG. 6 which is a functional block diagram of an operation stage of a pipeline ADC according to an embodiment of the present invention. The operation stage 600 of the pipeline ADC includes a multiplying circuit 610, a sub-ADC 620, and a multiplexer 630. The multiplying circuit 610 may be embodied by the multiplying circuit 200, the multiplying circuit 300, or the multiplying circuit 400. The sub-ADC 620 generates a digital code BC according to the input signal VIP and the input signal VIN. The multiplexer 630 determines the reference voltage Vr1 and reference voltage Vr2 from multiple candidate voltages (including but not limited to the reference voltage Vrp, the reference voltage Vrn, 0.5Vrp, 0.5Vrn, and Vcm', where Vcm' may be the common mode voltage of the reference voltage Vrp and the reference voltage Vrn) according to the digital code BC. The reference voltage Vr1 and the reference voltage Vr2 are reference voltages that define the input range of the multiplying circuit 610. The operating principle of the operation stage 600 of the pipeline ADC is well known to people having ordinary skill in the art, and the details are omitted for brevity.

As discussed above, the output signal VOP (the output signal VON) is associated with the threshold voltage Vt of the transistor NMp (the transistor NMpB), and the threshold voltage Vt is susceptible to the manufacturing process. Therefore, the common mode voltage of the output signal VOP and the output signal VON is affected by the manufacturing process. In addition, mismatches between the transistor NMp and the current source 222 and between the transistor NMpB and the current source 232 may also occur during the circuit manufacturing process. Therefore, the present invention further provides a reference voltage generation circuit to solve this problem.

Figure 7:
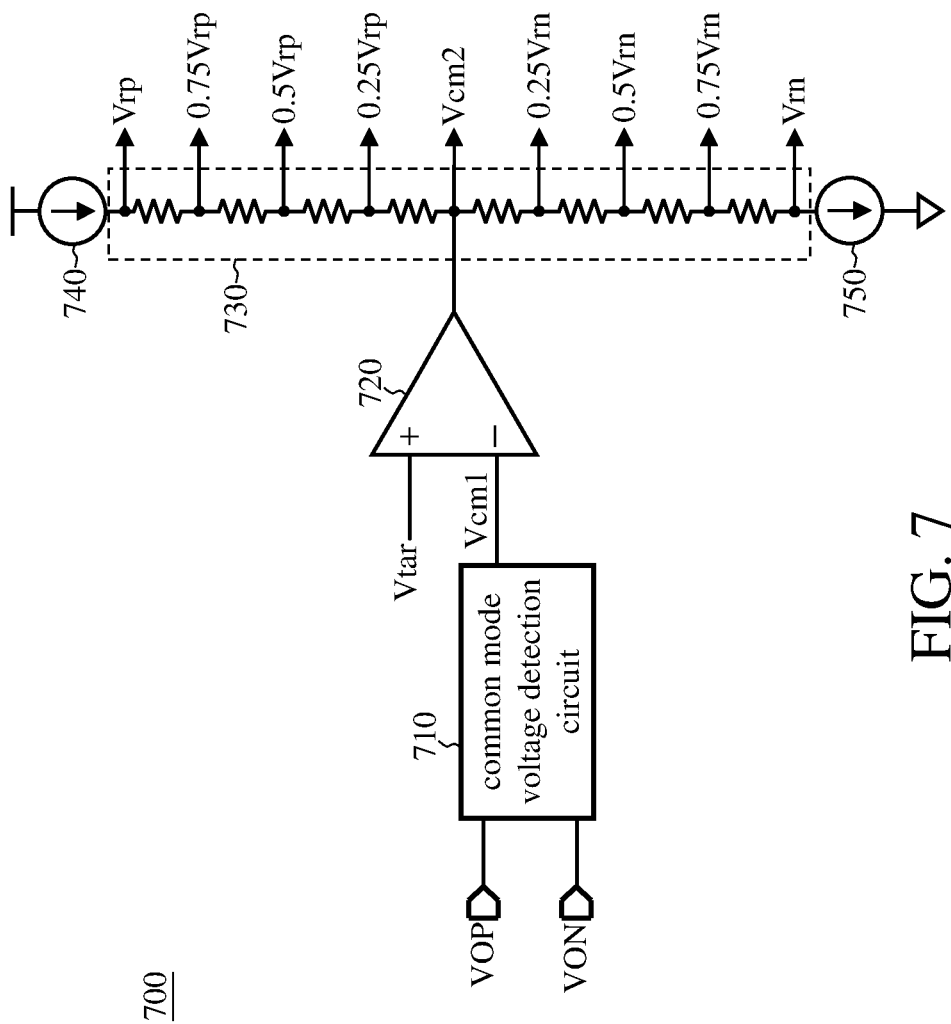
FIG. 7 is a functional block diagram of a reference voltage generation circuit according to an embodiment of the present invention.

FIG. 7 is a functional block diagram of a reference voltage generation circuit according to an embodiment of the present invention. The reference voltage generation circuit 700 includes a common mode voltage detection circuit 710, an amplifier 720, a resistor array 730, a current source 740, and a current source 750.

The common mode voltage detection circuit 710 detects the common mode voltage Vcm1 of the output signal VOP and the output signal VON.

The inverting input terminal of the amplifier 720 receives the common mode voltage Vcm1; the non-inverting input terminal of the amplifier 720 receives a target voltage Vtar; the output terminal of the amplifier 720 outputs the adjusted common mode voltage Vcm2. Therefore, when the common mode voltage Vcm1 becomes smaller (larger), the adjusted common mode voltage Vcm2 becomes larger (smaller).

The resistor array 730 includes a plurality of resistors connected in series, and the current source 740, the resistor array 730, and the current source 750 are connected in series.

The output terminal of the amplifier 720 is coupled or electrically connected to an intermediate resistor of the resistor array 730 (i.e., not to the resistor at either terminal of the resistor array 730). As a result, when the adjusted common mode voltage Vcm2 becomes larger (smaller), the reference voltage Vrp and the reference voltage Vrn become larger (smaller) accordingly. In other words, the reference voltage generation circuit 700 can adjust the reference voltage according to the common mode voltage Vcm1 of the output signal VOP and the output signal VON. More specifically (see FIG. 6), the reference voltage Vr1 and the reference voltage Vr2 vary with the common mode voltage Vcm1 of the output signal VOP and the output signal VON. For example, when the common mode voltage Vcm1 becomes smaller (larger), the adjusted common mode voltage Vcm2 becomes larger (smaller), causing the reference voltage Vr1 and the reference voltage Vr2 to become larger (smaller), which in turn causes the intermediate voltage VT1 and the intermediate voltage VT2 to become larger (smaller), achieving the effect of stabilizing the common mode voltage Vcm1 (i.e., making the output signal VOP and the output signal VON less susceptible to the manufacturing process).

Note that the shape, size, and ratio of any element in the disclosed figures are exemplary for understanding, not for limiting the scope of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. An operation stage of a pipeline analog-to-digital converter (ADC), wherein the operation stage has a first output terminal and a second output terminal and is configured to generate a first output signal and a second output signal according to a first input signal and a second input signal, the operation stage comprising:
 a sub-ADC configured to generate a digital code according to the first input signal and the second input signal;
 a multiplexer coupled to the sub-ADC and configured to generate a first reference voltage and a second reference voltage according to the digital code;
 a voltage conversion circuit configured to generate a first intermediate voltage and a second intermediate voltage according to the first input signal, the second input signal, the first reference voltage, and the second reference voltage;
 a first transistor having a first terminal, a second terminal, and a first control terminal, wherein the first terminal is coupled to the first output terminal, the second terminal is coupled to a first power supply voltage, and the first control terminal receives the first intermediate voltage;
 a first current source coupled between the first terminal and a second power supply voltage;
 a second transistor having a third terminal, a fourth terminal, and a second control terminal, wherein the third terminal is coupled to the second output terminal, the fourth terminal is coupled to the first power supply voltage, and the second control terminal receives the second intermediate voltage; and
 a second current source coupled between the third terminal and the second power supply voltage.

2. The operation stage of claim 1, wherein the first input signal is a common mode voltage plus a voltage difference, the second input signal is the common mode voltage minus the voltage difference, the first intermediate voltage is the first reference voltage minus M times the voltage difference, and the second intermediate voltage is the second reference voltage plus M times the voltage difference, M being a positive integer.

3. The operation stage of claim 2, wherein M is two, the voltage conversion circuit comprising:
 a first capacitor having a fifth terminal and a sixth terminal, wherein the sixth terminal is coupled to the first control terminal;

a first switch having a seventh terminal and an eighth terminal, wherein the seventh terminal receives the first input signal, and the eighth terminal is coupled to the fifth terminal;

a second switch having a ninth terminal and a tenth terminal, wherein the ninth terminal receives the first reference voltage, and the tenth terminal is coupled to the fifth terminal;

a third switch having an eleventh terminal and a twelfth terminal, wherein the eleventh terminal receives the second input signal, and the twelfth terminal is coupled to the sixth terminal;

a second capacitor having a thirteenth terminal and a fourteenth terminal, wherein the fourteenth terminal is coupled to the second control terminal;

a fourth switch having a fifteenth terminal and a sixteenth terminal, wherein the fifteenth terminal receives the second input signal, and the sixteenth terminal is coupled to the thirteenth terminal;

a fifth switch having a seventeenth terminal and an eighteenth terminal, wherein the seventeenth terminal receives the second reference voltage, and the eighteenth terminal is coupled to the thirteenth terminal; and a sixth switch having a nineteenth terminal and a twentieth terminal, wherein the nineteenth terminal receives the first input signal, and the twentieth terminal is coupled to the fourteenth terminal.

4. The operation stage of claim 3, wherein when a clock is at a first level, the first switch is turned on, the second switch is turned off, the third switch is turned on, the fourth switch is turned on, the fifth switch is turned off, and the sixth switch is turned on; when the clock is at a second level, the first switch is turned off, the second switch is turned on, the third switch is turned off, the fourth switch is turned off, the fifth switch is turned on, and the sixth switch is turned off.

5. The operation stage of claim 2, wherein M is three, the voltage conversion circuit comprising:
  a first capacitor having a fifth terminal and a sixth terminal;
  a first switch having a seventh terminal and an eighth terminal, wherein the seventh terminal receives a third reference voltage, and the eighth terminal is coupled to the fifth terminal;
  a second switch having a ninth terminal and a tenth terminal, wherein the ninth terminal receives the first reference voltage, and the tenth terminal is coupled to the fifth terminal;
  a third switch having an eleventh terminal and a twelfth terminal, wherein the eleventh terminal receives the second input signal, and the twelfth terminal is coupled to the sixth terminal;
  a fourth switch having a thirteenth terminal and a fourteenth terminal, wherein the thirteenth terminal is coupled to the sixth terminal;
  a second capacitor having a fifteenth terminal and a sixteenth terminal, wherein the fifteenth terminal is coupled to the first control terminal, and the sixteenth terminal is coupled to the fourteenth terminal;
  a fifth switch having a seventeenth terminal and an eighteenth terminal, wherein the seventeenth terminal receives the second input signal, and the eighteenth terminal is coupled to the fifteenth terminal;
  a sixth switch having a nineteenth terminal and a twentieth terminal, wherein the nineteenth terminal receives the first input signal, and the twentieth terminal is coupled to the sixteenth terminal;
  a third capacitor having a twenty-first terminal and a twenty-second terminal;
  a seventh switch having a twenty-third terminal and a twenty-fourth terminal, wherein the twenty-third terminal receives the third reference voltage, and the twenty-fourth terminal is coupled to the twenty-first terminal;
  an eighth switch having a twenty-fifth terminal and a twenty-sixth terminal, wherein the twenty-fifth terminal receives the second reference voltage, and the twenty-sixth terminal is coupled to the twenty-first terminal;
  a ninth switch having a twenty-seventh terminal and a twenty-eighth terminal, wherein the twenty-seventh terminal receives the first input signal, and the twenty-eighth terminal is coupled to the twenty-second terminal;
  a tenth switch having a twenty-ninth terminal and a thirtieth terminal, wherein the twenty-ninth terminal is coupled to the twenty-second terminal;
  a fourth capacitor having a thirty-first terminal and a thirty-second terminal, wherein the thirty-first terminal is coupled to the second control terminal, and the thirty-second terminal is coupled to the thirtieth terminal;
  an eleventh switch having a thirty-third terminal and a thirty-fourth terminal, wherein the thirty-third terminal receives the first input signal, and the thirty-fourth terminal is coupled to the thirty-first terminal; and
  a twelfth switch having a thirty-fifth terminal and a thirty-sixth terminal, wherein the thirty-fifth terminal receives the second input signal, and the thirty-sixth terminal is coupled to the thirty-second terminal.

6. The operation stage of claim 5, wherein when a clock is at a first level, the first switch is turned on, the second switch is turned off, the third switch is turned on, the fourth switch is turned off, the fifth switch is turned on, the sixth switch is turned on, the seventh switch is turned on, the eighth switch is turned off, the ninth switch is turned on, the tenth switch is turned off, the eleventh switch is turned on, and the twelfth switch is turned on; when the clock is at a second level, the first switch is turned off, the second switch is turned on, the third switch is turned off, the fourth switch is turned on, the fifth switch is turned off, the sixth switch is turned off, the seventh switch is turned off, the eighth switch is turned on, the ninth switch is turned off, the tenth switch is turned on, the eleventh switch is turned off, and the twelfth switch is turned off.

7. The operation stage of claim 2, wherein M is four, the voltage conversion circuit comprising:
  a first capacitor having a fifth terminal and a sixth terminal;
  a first switch having a seventh terminal and an eighth terminal, wherein the seventh terminal receives the first input signal, and the eighth terminal is coupled to the fifth terminal;
  a second switch having a ninth terminal and a tenth terminal, wherein the ninth terminal receives the first reference voltage, and the tenth terminal is coupled to the fifth terminal;
  a third switch having an eleventh terminal and a twelfth terminal, wherein the eleventh terminal receives the second input signal, and the twelfth terminal is coupled to the sixth terminal;

a fourth switch having a thirteenth terminal and a fourteenth terminal, wherein the thirteenth terminal is coupled to the sixth terminal;

a second capacitor having a fifteenth terminal and a sixteenth terminal, wherein the fifteenth terminal is coupled to the first control terminal, and the sixteenth terminal is coupled to the fourteenth terminal;

a fifth switch having a seventeenth terminal and an eighteenth terminal, wherein the seventeenth terminal receives the second input signal, and the eighteenth terminal is coupled to the fifteenth terminal;

a sixth switch having a nineteenth terminal and a twentieth terminal, wherein the nineteenth terminal receives the first input signal, and the twentieth terminal is coupled to the sixteenth terminal;

a third capacitor having a twenty-first terminal and a twenty-second terminal;

a seventh switch having a twenty-third terminal and a twenty-fourth terminal, wherein the twenty-third terminal receives the second input signal, and the twenty-fourth terminal is coupled to the twenty-first terminal;

an eighth switch having a twenty-fifth terminal and a twenty-sixth terminal, wherein the twenty-fifth terminal receives the second reference voltage, and the twenty-sixth terminal is coupled to the twenty-first terminal;

a ninth switch having a twenty-seventh terminal and a twenty-eighth terminal, wherein the twenty-seventh terminal receives the first input signal, and the twenty-eighth terminal is coupled to the twenty-second terminal;

a tenth switch having a twenty-ninth terminal and a thirtieth terminal, wherein the twenty-ninth terminal is coupled to the twenty-second terminal;

a fourth capacitor having a thirty-first terminal and a thirty-second terminal, wherein the thirty-first terminal is coupled to the second control terminal, and the thirty-second terminal is coupled to the thirtieth terminal;

an eleventh switch having a thirty-third terminal and a thirty-fourth terminal, wherein the thirty-third terminal receives the first input signal, and the thirty-fourth terminal is coupled to the thirty-first terminal; and a twelfth switch having a thirty-fifth terminal and a thirty-sixth terminal, wherein the thirty-fifth terminal receives the second input signal, and the thirty-sixth terminal is coupled to the thirty-second terminal.

8. The operation stage of claim 7, wherein when a clock is at a first level, the first switch is turned on, the second switch is turned off, the third switch is turned on, the fourth switch is turned off, the fifth switch is turned on, the sixth switch is turned on, the seventh switch is turned on, the eighth switch is turned off, the ninth switch is turned on, the tenth switch is turned off, the eleventh switch is turned on, and the twelfth switch is turned on; when the clock is at a second level, the first switch is turned off, the second switch is turned on, the third switch is turned off, the fourth switch is turned on, the fifth switch is turned off, the sixth switch is turned off, the seventh switch is turned off, the eighth switch is turned on, the ninth switch is turned off, the tenth switch is turned on, the eleventh switch is turned off, and the twelfth switch is turned off.

9. The operation stage of claim 2, wherein the common mode voltage is a first common mode voltage, the operation stage further comprising:

a common mode voltage detection circuit configured to generate a second common mode voltage according to the first output signal and the second output signal;

an amplifier configured to receive the second common mode voltage and a target voltage and generate an adjusted common mode voltage;

a third current source;

a fourth current source; and a resistor array comprising a plurality of resistors connected in series between the third current source and the fourth current source;

wherein an output terminal of the amplifier is electrically connected to an intermediate resistor of the resistor array.

10. A multiplying circuit having a first output terminal and a second output terminal and configured to generate a first output signal and a second output signal according to a first input signal and a second input signal, the multiplying circuit comprising:

a voltage conversion circuit configured to generate a first intermediate voltage and a second intermediate voltage according to the first input signal and the second input signal;

a first transistor having a first terminal, a second terminal, and a first control terminal, wherein the first terminal is coupled to the first output terminal, the second terminal is coupled to a first power supply voltage, and the first control terminal receives the first intermediate voltage;

a first current source coupled between the first terminal and a second power supply voltage;

a second transistor having a third terminal, a fourth terminal, and a second control terminal, wherein the third terminal is coupled to the second output terminal, the fourth terminal is coupled to the first power supply voltage, and the second control terminal receives the second intermediate voltage; and a second current source coupled between the third terminal and the second power supply voltage.

11. The multiplying circuit of claim 10, wherein the first input signal is a common mode voltage plus a voltage difference, the second input signal is the common mode voltage minus the voltage difference, the first intermediate voltage is a first reference voltage minus M times the voltage difference, and the second intermediate voltage is a second reference voltage plus M times the voltage difference, M being a positive integer.

12. The multiplying circuit of claim 11, wherein M is two, the voltage conversion circuit comprising:

a first capacitor having a fifth terminal and a sixth terminal, wherein the sixth terminal is coupled to the first control terminal;

a first switch having a seventh terminal and an eighth terminal, wherein the seventh terminal receives the first input signal, and the eighth terminal is coupled to the fifth terminal;

a second switch having a ninth terminal and a tenth terminal, wherein the ninth terminal receives the first reference voltage, and the tenth terminal is coupled to the fifth terminal;

a third switch having an eleventh terminal and a twelfth terminal, wherein the eleventh terminal receives the second input signal, and the twelfth terminal is coupled to the sixth terminal;

a second capacitor having a thirteenth terminal and a fourteenth terminal, wherein the fourteenth terminal is coupled to the second control terminal;

a fourth switch having a fifteenth terminal and a sixteenth terminal, wherein the fifteenth terminal receives the second input signal, and the sixteenth terminal is coupled to the thirteenth terminal;

a fifth switch having a seventeenth terminal and an eighteenth terminal, wherein the seventeenth terminal receives the second reference voltage, and the eighteenth terminal is coupled to the thirteenth terminal; and a sixth switch having a nineteenth terminal and a twentieth terminal, wherein the nineteenth terminal receives the first input signal, and the twentieth terminal is coupled to the fourteenth terminal.

13. The multiplying circuit of claim 12, wherein when a clock is at a first level, the first switch is turned on, the second switch is turned off, the third switch is turned on, the fourth switch is turned on, the fifth switch is turned off, and the sixth switch is turned on; when the clock is at a second level, the first switch is turned off, the second switch is turned on, the third switch is turned off, the fourth switch is turned off, the fifth switch is turned on, and the sixth switch is turned off.

14. The multiplying circuit of claim 12 further comprising:

a seventh switch having a twenty-first terminal and a twenty-second terminal, wherein the twenty-first terminal is coupled to the sixth terminal, and the twenty-second terminal is coupled to the first control terminal; and an eighth switch having a twenty-third terminal and a twenty-fourth terminal, wherein the twenty-third terminal is coupled to the fourteenth terminal, and the twenty-fourth terminal is coupled to the second control terminal.

15. The multiplying circuit of claim 11, wherein M is three, the voltage conversion circuit comprising:

a first capacitor having a fifth terminal and a sixth terminal;

a first switch having a seventh terminal and an eighth terminal, wherein the seventh terminal receives a third reference voltage, and the eighth terminal is coupled to the fifth terminal;

a second switch having a ninth terminal and a tenth terminal, wherein the ninth terminal receives the first reference voltage, and the tenth terminal is coupled to the fifth terminal;

a third switch having an eleventh terminal and a twelfth terminal, wherein the eleventh terminal receives the second input signal, and the twelfth terminal is coupled to the sixth terminal;

a fourth switch having a thirteenth terminal and a fourteenth terminal, wherein the thirteenth terminal is coupled to the sixth terminal;

a second capacitor having a fifteenth terminal and a sixteenth terminal, wherein the fifteenth terminal is coupled to the first control terminal, and the sixteenth terminal is coupled to the fourteenth terminal;

a fifth switch having a seventeenth terminal and an eighteenth terminal, wherein the seventeenth terminal receives the second input signal, and the eighteenth terminal is coupled to the fifteenth terminal;

a sixth switch having a nineteenth terminal and a twentieth terminal, wherein the nineteenth terminal receives the first input signal, and the twentieth terminal is coupled to the sixteenth terminal;

a third capacitor having a twenty-first terminal and a twenty-second terminal;

a seventh switch having a twenty-third terminal and a twenty-fourth terminal, wherein the twenty-third terminal receives the third reference voltage, and the twenty-fourth terminal is coupled to the twenty-first terminal;

an eighth switch having a twenty-fifth terminal and a twenty-sixth terminal, wherein the twenty-fifth terminal receives the second reference voltage, and the twenty-sixth terminal is coupled to the twenty-first terminal;

a ninth switch having a twenty-seventh terminal and a twenty-eighth terminal, wherein the twenty-seventh terminal receives the first input signal, and the twenty-eighth terminal is coupled to the twenty-second terminal;

a tenth switch having a twenty-ninth terminal and a thirtieth terminal, wherein the twenty-ninth terminal is coupled to the twenty-second terminal;

a fourth capacitor having a thirty-first terminal and a thirty-second terminal, wherein the thirty-first terminal is coupled to the second control terminal, and the thirty-second terminal is coupled to the thirtieth terminal;

an eleventh switch having a thirty-third terminal and a thirty-fourth terminal, wherein the thirty-third terminal receives the first input signal, and the thirty-fourth terminal is coupled to the thirty-first terminal; and a twelfth switch having a thirty-fifth terminal and a thirty-sixth terminal, wherein the thirty-fifth terminal receives the second input signal, and the thirty-sixth terminal is coupled to the thirty-second terminal.

16. The multiplying circuit of claim 15, wherein when a clock is at a first level, the first switch is turned on, the second switch is turned off, the third switch is turned on, the fourth switch is turned off, the fifth switch is turned on, the sixth switch is turned on, the seventh switch is turned on, the eighth switch is turned off, the ninth switch is turned on, the tenth switch is turned off, the eleventh switch is turned on, and the twelfth switch is turned on; when the clock is at a second level, the first switch is turned off, the second switch is turned on, the third switch is turned off, the fourth switch is turned on, the fifth switch is turned off, the sixth switch is turned off, the seventh switch is turned off, the eighth switch is turned on, the ninth switch is turned off, the tenth switch is turned on, the eleventh switch is turned off, and the twelfth switch is turned off.

17. The multiplying circuit of claim 15 further comprising:

a thirteenth switch having a thirty-seventh terminal and a thirty-eighth terminal, wherein the thirty-seventh terminal is coupled to the fifteenth terminal, and the thirty-eighth terminal is coupled to the first control terminal; and a fourteenth switch having a thirty-ninth terminal and a fortieth terminal, wherein the thirty-ninth terminal is coupled to the thirty-first terminal, and the fortieth terminal is coupled to the second control terminal.

18. The multiplying circuit of claim 11, wherein M is four, the voltage conversion circuit comprising:

a first capacitor having a fifth terminal and a sixth terminal;

a first switch having a seventh terminal and an eighth terminal, wherein the seventh terminal receives the first input signal, and the eighth terminal is coupled to the fifth terminal;

a second switch having a ninth terminal and a tenth terminal, wherein the ninth terminal receives the first reference voltage, and the tenth terminal is coupled to the fifth terminal;

a third switch having an eleventh terminal and a twelfth terminal, wherein the eleventh terminal receives the second input signal, and the twelfth terminal is coupled to the sixth terminal;

a fourth switch having a thirteenth terminal and a fourteenth terminal, wherein the thirteenth terminal is coupled to the sixth terminal;

a second capacitor having a fifteenth terminal and a sixteenth terminal, wherein the fifteenth terminal is coupled to the first control terminal, and the sixteenth terminal is coupled to the fourteenth terminal;

a fifth switch having a seventeenth terminal and an eighteenth terminal, wherein the seventeenth terminal receives the second input signal, and the eighteenth terminal is coupled to the fifteenth terminal;

a sixth switch having a nineteenth terminal and a twentieth terminal, wherein the nineteenth terminal receives the first input signal, and the twentieth terminal is coupled to the sixteenth terminal;

a third capacitor having a twenty-first terminal and a twenty-second terminal;

a seventh switch having a twenty-third terminal and a twenty-fourth terminal, wherein the twenty-third terminal receives the second input signal, and the twenty-fourth terminal is coupled to the twenty-first terminal;

an eighth switch having a twenty-fifth terminal and a twenty-sixth terminal, wherein the twenty-fifth terminal receives the second reference voltage, and the twenty-sixth terminal is coupled to the twenty-first terminal;

a ninth switch having a twenty-seventh terminal and a twenty-eighth terminal, wherein the twenty-seventh terminal receives the first input signal, and the twenty-eighth terminal is coupled to the twenty-second terminal;

a tenth switch having a twenty-ninth terminal and a thirtieth terminal, wherein the twenty-ninth terminal is coupled to the twenty-second terminal;

a fourth capacitor having a thirty-first terminal and a thirty-second terminal, wherein the thirty-first terminal is coupled to the second control terminal, and the thirty-second terminal is coupled to the thirtieth terminal;

an eleventh switch having a thirty-third terminal and a thirty-fourth terminal, wherein the thirty-third terminal receives the first input signal, and the thirty-fourth terminal is coupled to the thirty-first terminal; and a twelfth switch having a thirty-fifth terminal and a thirty-sixth terminal, wherein the thirty-fifth terminal receives the second input signal, and the thirty-sixth terminal is coupled to the thirty-second terminal.

19. The multiplying circuit of claim 18, wherein when a clock is at a first level, the first switch is turned on, the second switch is turned off, the third switch is turned on, the fourth switch is turned off, the fifth switch is turned on, the sixth switch is turned on, the seventh switch is turned on, the eighth switch is turned off, the ninth switch is turned on, the tenth switch is turned off, the eleventh switch is turned on, and the twelfth switch is turned on; when the clock is at a second level, the first switch is turned off, the second switch is turned on, the third switch is turned off, the fourth switch is turned on, the fifth switch is turned off, the sixth switch is turned off, the seventh switch is turned off, the eighth switch is turned on, the ninth switch is turned off, the tenth switch is turned on, the eleventh switch is turned off, and the twelfth switch is turned off.

20. The multiplying circuit of claim 18 further comprising:

a thirteenth switch having a thirty-seventh terminal and a thirty-eighth terminal, wherein the thirty-seventh terminal is coupled to the fifteenth terminal, and the thirty-eighth terminal is coupled to the first control terminal; and a fourteenth switch having a thirty-ninth terminal and a fortieth terminal, wherein the thirty-ninth terminal is coupled to the thirty-first terminal, and the fortieth terminal is coupled to the second control terminal.

* * * * *